United States Patent
Suzuki et al.

(10) Patent No.: US 8,294,480 B2
(45) Date of Patent: Oct. 23, 2012

(54) INSPECTION APPARATUS HAVING ALIGNMENT MECHANISM

(75) Inventors: Masaru Suzuki, Nirasaki (JP); Yasuhito Yamamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 128 days.

(21) Appl. No.: 12/053,354

(22) Filed: Mar. 21, 2008

(65) Prior Publication Data

US 2008/0231301 A1    Sep. 25, 2008

(30) Foreign Application Priority Data

Mar. 23, 2007   (JP) ................................ 2007-077920

(51) Int. Cl.
*G01R 31/28* (2006.01)
(52) U.S. Cl. .............................. 324/750.16; 324/750.23
(58) Field of Classification Search .................. None
See application file for complete search history.

(56) References Cited

U.S. PATENT DOCUMENTS

| | | | | |
|---|---|---|---|---|
| 4,266,191 A * | 5/1981 | Spano et al. | ................... | 324/758 |
| 4,677,474 A * | 6/1987 | Sato et al. | ........................ | 348/87 |
| 5,113,132 A * | 5/1992 | Hoshi | ............................ | 324/758 |
| 5,321,352 A * | 6/1994 | Takebuchi | ................. | 324/750.17 |
| 5,404,111 A * | 4/1995 | Mori et al. | ................ | 324/750.23 |
| 5,412,329 A * | 5/1995 | Iino et al. | .................... | 324/750.18 |
| 5,510,724 A * | 4/1996 | Itoyama et al. | ........... | 324/750.05 |
| 5,585,738 A * | 12/1996 | Kuji et al. | ................. | 324/750.19 |
| 5,644,245 A * | 7/1997 | Saitoh et al. | ................... | 324/754 |
| 5,691,764 A * | 11/1997 | Takekoshi et al. | .............. | 348/86 |
| 5,999,268 A * | 12/1999 | Yonezawa et al. | ............. | 356/399 |
| 7,135,883 B2 * | 11/2006 | Komatsu | ................... | 324/750.17 |
| 7,196,507 B2 * | 3/2007 | Schneidewind et al. | . . | 324/750.16 |
| 7,262,618 B2 * | 8/2007 | Komatsu | ................... | 324/750.19 |
| 2004/0046545 A1 * | 3/2004 | Akiyama et al. | ............ | 324/158.1 |
| 2004/0234362 A1 * | 11/2004 | Iijima et al. | ................. | 414/222.1 |

FOREIGN PATENT DOCUMENTS

| | | |
|---|---|---|
| JP | H05-333100 | 12/1993 |
| JP | 2006-128451 | 5/2006 |
| JP | 2006-135217 | 5/2006 |
| KR | 10-1998-0032904 | 7/1998 |

* cited by examiner

*Primary Examiner* — Paresh Patel
(74) *Attorney, Agent, or Firm* — Oblon, Spivak, McClelland, Maier & Neustadt, L.L.P.

(57) ABSTRACT

An inspection apparatus includes a mounting table movable in X and Y directions and an alignment mechanism which performs an alignment of a target object placed on the mounting table. Further, the alignment mechanism includes an image pickup device which is movable in either one of the X and Y directions and is capable of being stopped at a desired position and a controller for performing a preliminary alignment of the target object by moving the image pickup device and the mounting table in respectively movable directions.

12 Claims, 7 Drawing Sheets

INSPECTION APPARATUS HAVING ALIGNMENT MECHANISM

FIELD OF THE INVENTION

The present invention relates to an inspection apparatus capable of reducing a footprint thereof.

BACKGROUND OF THE INVENTION

A conventional inspection apparatus includes a prober chamber for performing inspection of electrical characteristics of, for example, semiconductor wafers and a loader chamber for performing a transfer of the semiconductor wafers one by one between a cassette and the prober chamber. A prober card and an alignment mechanism are disposed in the prober chamber. After a semiconductor wafer on a wafer chuck is aligned with the probe card by the alignment mechanism, the semiconductor wafer and the probe card are brought into electrical contact with each other, so that inspection of electrical characteristics of the wafer is carried out. Inside the loader chamber, there is provided a wafer transfer device which serves to transfer the semiconductor wafers between the cassette and the wafer chuck.

However, as the diameter of a semiconductor wafer increases over 300 mm, the size of the inspection apparatus becomes large, resulting in a cost increase due to a rapid enlargement of a space occupied by the inspection apparatus within a clean room as well as a cost increase of the inspection apparatus itself. Furthermore, with the trend toward the large diameter of the semiconductor wafer and high integration of semiconductor chips thereon, a time period during which the semiconductor wafer stays in the inspection apparatus increases, necessitating efficient manipulation of the semiconductor wafer.

Patent Reference 1 describes a prober apparatus having a configuration in which a plurality of wafer chucks in a prober unit shares a common alignment mechanism. In this prober apparatus, since a plurality of (for example, two) mounting tables share the single alignment mechanism, a cost reduction can be realized. Further, since inspection can be carried out at the plurality of wafer chucks simultaneously, a throughput can be improved as well.

Patent Reference 2 describes a wafer inspection apparatus which inspects semiconductor wafers one by one. In this wafer inspection apparatus, it is attempted to reduce an inspection time by way of performing a single-sheet process of transferring semiconductor wafers one by one between a cassette stocking portion and wafer inspection units by using a first and a second self-propelled carriage.

Moreover, Patent Reference 3 describes a glass substrate moving carriage which serves to perform a sampling test of a glass substrate in processing apparatuses. Since this glass substrate moving carriage includes a positioning and transferring device, a positioning and transferring device of each processing apparatus can be omitted, thus resulting in a reduction of a footprint of each processing apparatus.

(Patent Reference 1)
Japanese Patent Laid-open Application No. S63-062249
(Patent Reference 2)
Japanese Patent No. 3312748
(Patent Reference 3)
Japanese Patent Laid-open Application No. 2002-313870

As for the technique described in Patent Reference 1, however, since the alignment mechanism is fixed at a central position between the two wafer chucks and alignment of a wafer on each wafer chuck with a probe card is performed by moving each wafer chuck to a position directly under the alignment mechanism, a movement range of each wafer chuck is large and there is a limit in reducing the footprint.

In the technique of Patent Reference 2, though the semiconductor wafer single-sheet process may contribute to the reduction of the inspection time, the inspection units themselves have the substantially same configurations as that of the conventional inspection apparatus, and it is required to provide a space between the individual wafer inspection units. Thus, it is impossible to reduce the footprints of the wafer inspection units themselves. Further, the technique of Patent Reference 3 also requires provision of a space between the processing apparatuses.

SUMMARY OF THE INVENTION

In view of the foregoing, the present invention provides an inspection apparatus capable of improving an inspection throughput by way of reducing a footprint thereof drastically, and also capable of minimizing a movement range of a mounting table.

In accordance with a first aspect of the present invention, there is provided an inspection apparatus including: a mounting table movable in X and Y directions; an alignment mechanism which performs an alignment of a target object placed on the mounting table, the alignment mechanism including an image pickup device which is movable only in one of the X and Y directions and is allowed to be stopped at any positions; and a controller for performing the alignment of the target object by moving the image pickup device and the mounting table in their movable directions.

In accordance with a second aspect of the present invention, there is provided an inspection apparatus including: a plurality of mounting tables movable in X and Y directions and arranged along either one of the X and Y directions; an alignment mechanism which performs an alignment of target objects placed on the mounting tables, the alignment mechanism including an image pickup device which is movable only in an arrangement direction of the mounting tables to capture images of the respective target objects on the mounting tables and is allowed to be stopped at any positions; and a controller for performing the alignment of the target objects by moving the image pickup device and the mounting tables in their movable directions.

In accordance with a third aspect of the present invention, there is provided an inspection apparatus including two mounting tables movable in X and Y directions and arranged along either one of the X and Y directions and an alignment mechanism which performs an alignment of target objects placed on the two mounting tables. The alignment mechanism including an image pickup device which is movable only in an arrangement direction of the two mounting tables to capture images of the respective target objects and is allowed to be stopped at any positions and a controller for performing the alignment of one of the target objects by moving the first image pickup device and the mounting tables in their movable directions.

The inspection apparatus in accordance with the first to third aspects of the present invention may further include a probe card disposed above each mounting table, wherein additional image pickup devices for capturing an image of the probe card are provided at plural locations of each mounting table which are distanced away from each other at a specific interval.

The inspection apparatus in accordance with the second and third aspects of the present invention may further include a probe card disposed above each mounting table, wherein two additional image pickup devices are provided at two locations of each mounting table which are distanced away from each other at an interval of 180° in a circumferential direction of each mounting table.

It is preferable that the two additional image pickup devices are opposedly disposed along the arrangement direction of the mounting tables.

Alternatively, the two additional image pickup devices opposedly are disposed along a direction perpendicular to the arrangement direction of the mounting tables.

Alternatively, the two additional image pickup devices opposedly are disposed at locations inclined from the X and Y directions by 45°.

Further, the two additional image pickup devices may be disposed at four locations distanced away from each other at an interval of 90° along a circumferential direction of each mounting table, and the two pairs of the additional image pickup devices located at an interval of 180° are arranged along the X direction and the Y directions, respectively.

The probe card is preferably brought into electrical contact with the entire surface of a corresponding target object.

The image pickup device is preferably provided at an alignment bridge.

Further, it is preferable that the controller performs the alignment by controlling each mounting table to be moved only in a direction perpendicular to a direction in which the image pickup device is movable.

Furthermore, the inspection apparatus may further includes wafer transfer mechanism between the mounting tables for delivering the target objects.

In accordance with the present invention, it is possible to improve an inspection throughput by way of reducing a footprint thereof drastically and also minimize a movement range of a mounting table.

BRIEF DESCRIPTION OF THE DRAWINGS

The above features of the present invention will become apparent from the following description of embodiments given in conjunction with the accompanying drawings, in which.

DETAILED DESCRIPTION OF THE EMBODIMENTS

Hereinafter, the present invention will be described with respect to embodiments illustrated in FIGS. 1 to 7, which form a part hereof.

(First Embodiment)

Figure 1:
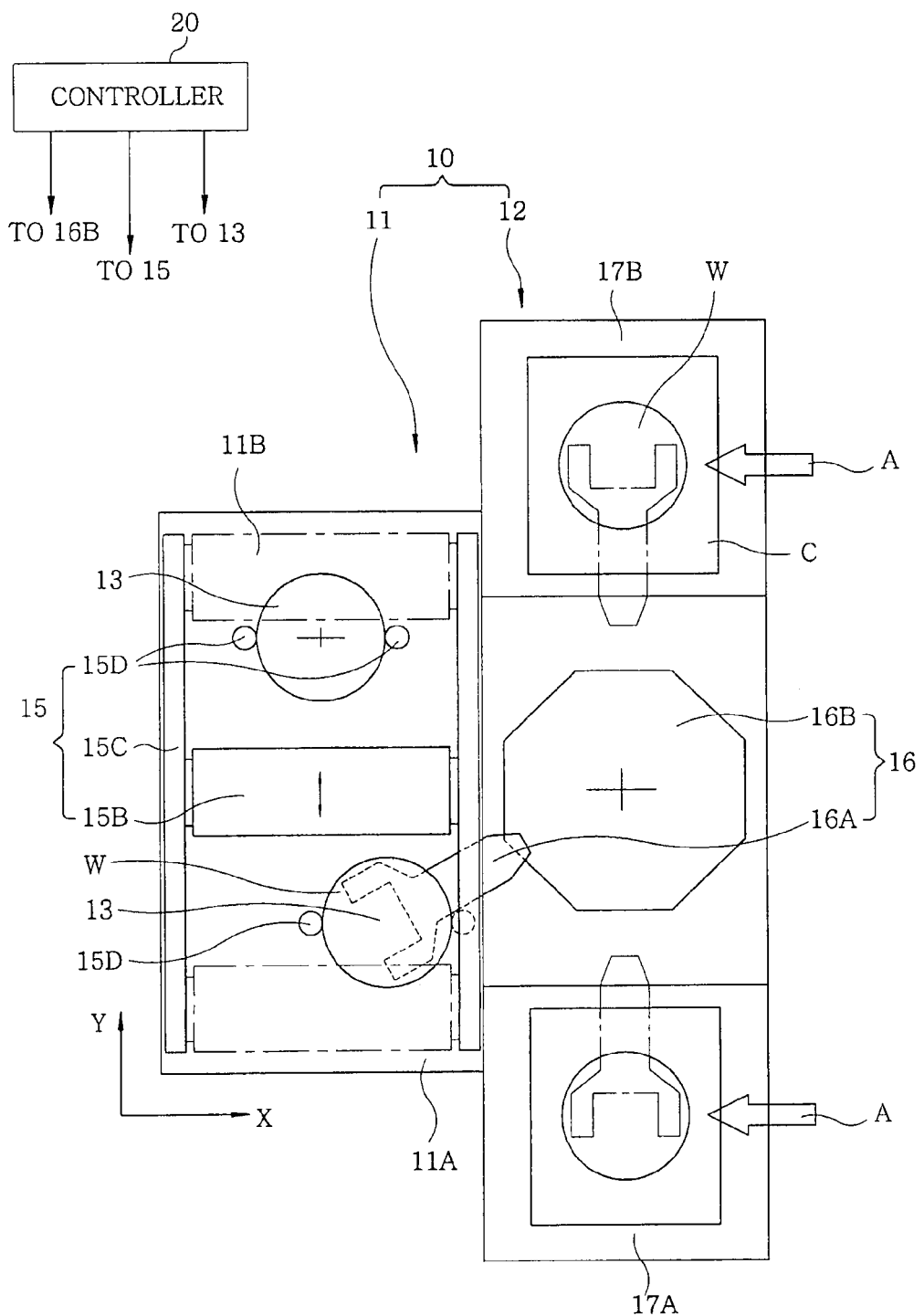
FIG. 1 is a plan view of an inspection apparatus in accordance with a first embodiment of the present invention.

An inspection apparatus 10 in accordance with a first embodiment of the present invention is configured to carry out an inspection of electrical characteristics of a target object to be inspected, for example, a semiconductor wafer W of 300 mm in diameter, by bringing a probe card into electrical contact with inspection electrode pads formed on an entire surface of the wafer at one time. As shown in FIG. 1, the inspection apparatus 10 includes a prober chamber 11 for performing the inspection of the electrical characteristics of the semiconductor wafer; a loader chamber 12 for transferring the semiconductor wafer W into the prober chamber 11; and a controller 20. The prober chamber 11 is divided into a first and a second probe area 11A and 11B, so two semiconductor wafers W can be respectively processed in the first and the second probe area under the control of the controller 20.

The prober chamber 11 includes two mounting tables 13 (hereinafter referred to as "wafer chucks") disposed in the first and the second prober area 11A and 11B to be movable in X, Y and Z directions, while each carrying semiconductor wafer W thereon; two probe cards 14 (see FIG. 2) respectively disposed above the wafer chucks 13; and an alignment mechanism 15 disposed to be movable between the first and the second probe area 11A and 11B.

The alignment mechanism 15 and the respective wafer chucks 13 in the first and the second probe area 11A and 11B cooperate to perform alignments of the probe cards 14 and the semiconductor wafers W disposed on the wafer chucks 13 under the control of a controller 20. That is, the single alignment mechanism 15 is used in both of the first and the second probe area 11A and 11B.

Figure 2:
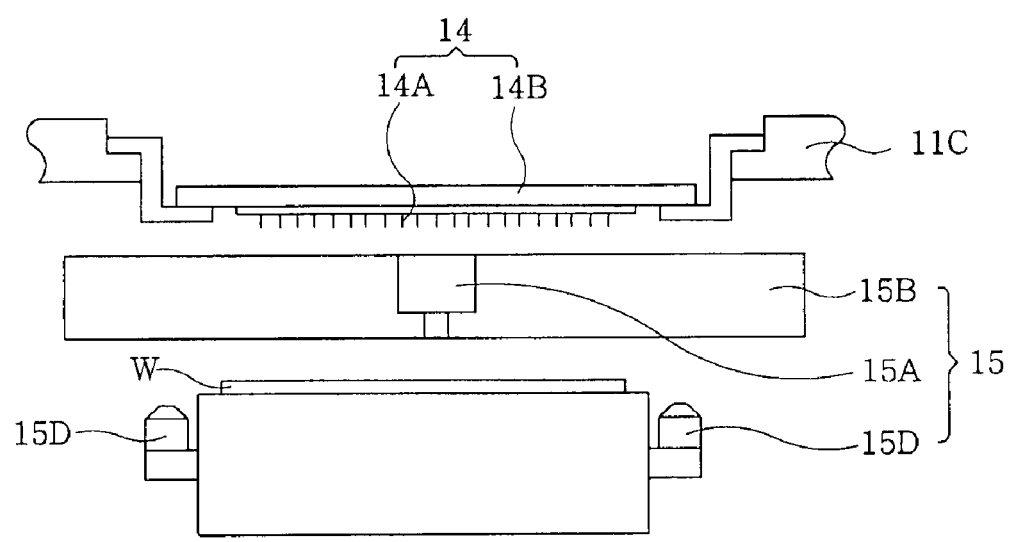
FIG. 2 sets forth a schematic diagram showing major components of the inspection apparatus of FIG. 1.

As shown in FIGS. 1 and 2, the alignment mechanism 15 includes a first image pickup device (for example, a first CCD camera) 15A (see FIG. 2) provided to capture images of the semiconductor wafers W; an alignment bridge 15B for supporting the first CCD camera 15A from its center; and a pair of guide rails 15C respectively extended in the Y direction at both X-directional end portions of the prober chamber 11, wherein the alignment bridge 15B is allowed to move in the Y direction along the guide rails 15C.

The first CCD camera 15A is moved between both Y-directional end portions (indicated by dashed dotted lines in FIG. 1) of the prober chamber 11 along the guide rails 15C via the alignment bridge 15B up to specific positions within the first and the second probe area 11A and 11B to be stopped thereat.

When the alignment of the semiconductor wafers W and corresponding probe cards 14 is carried out, the first CCD camera 15A is sequentially moved into the first and the second probe area 11A and 11B by the alignment bridge 15B and cooperates with the corresponding wafer chucks 13 to take images of the semiconductor wafers W thereof. While the wafer chucks 13 in the first and the second probe area 11A and 11B are moved in the X and Y directions, the entire region of each semiconductor wafer W is made to pass directly under the first CCD camera 15A, whereby images of all the inspection electrode pads formed on the entire surface of the semiconductor wafer W can be captured. While inspection is carried out, the alignment bridge 15B is in a standby position at a border area between the first and the second probe area 11A and 11B, as indicated by a solid line in FIG. 1.

A conventional alignment mechanism is reciprocatively moved between an innermost portion of a probe chamber in the Y direction and a probe center directly under a probe card, and is arranged to be stopped at the two positions. In the present embodiment, however, the alignment bridge 15B can be stopped at any Y-directional position inside the first and the second probe area 11A and 11B. Thus, the alignment of the semiconductor wafers W can be accomplished within a minimum movement range of the wafer chucks 13 by moving the wafer chuck 13 primarily in the X direction inside the first and the second probe area 11A and 11E as will be described later.

Further, as shown in FIGS. 1 and 2, each wafer chuck 13 is provided with two second image pickup devices (for example, second CCD cameras) 15D which constitute the alignment mechanism 15. The second CCD cameras 15D capture images of the probes 14A of the probe card 14. The two second CCD cameras 15D are disposed at the periphery of the wafer chuck 13 at an interval of 180° along the circumference of the wafer chuck 13 to be located on an X axis that passes through a center of the top surface of the wafer chuck 13. Though not shown in FIG. 1, each second CCD camera 15D has a low-magnification camera and a high-magnification camera, and is capable of microscopically and macroscopically capturing images of the probe card 14.

Each probe card 14 used in the present embodiment includes, e.g., a plurality of probes 14A simultaneously and individually brought into contact with entire inspection electrode pads (not shown) formed on the semiconductor wafer W in one-to-one correspondence. The probe card 14 is detachably installed at a head plate 11C of the prober chamber 11. The head plate 11C can be opened or closed via a hinge. The probes 14A are provided on a circuit board 14B having substantially same size as the semiconductor wafer W and connected to a cable (not shown) of a tester side via the circuit board 14B. The probes 14A are formed by micro-processing such as a lithography technique, an etching technique, and the like.

When alignment is carried out, the first CCD camera 15A captures the image of the entire surface of the semiconductor wafer W, and the second CCD cameras 15D take images of a Y-directional central portion of the probe card 14 as will be explained later. The alignment is performed based on the imaged position data thus obtained. Further, the inspection apparatus 10 in accordance with the first embodiment has a very compact structure with no test head because the probe card 14 and a tester are connected via the cable.

As shown in FIG. 1, the loader chamber 12 is adjacent to the prober chamber 11. A wafer transfer mechanism 16 is disposed in a Y-directional center of the loader chamber 12, and cassette mounting unit 17A and 17B for mounting cassettes C thereon are positioned at two opposite Y-directional end portions of the loader chamber 12. The wafer transfer mechanism 16 includes an arm 16A and a driving device 16B therefor. The arm 16A is driven by the driving device 16B to transfer semiconductor wafers W one by one between the cassettes C and the prober chamber 11, as illustrated by solid lines in FIG. 1.

Further, a pre-alignment mechanism (not shown) for performing a preliminary alignment of each semiconductor wafer W is provided below the cassette mounting member 17B of one side (upper side of FIG. 1). The pre-alignment mechanism performs a preliminary alignment of the semiconductor wafer W based on an orientation flat or a notch thereof. Further, a buffer table or a wafer table (not shown) is provided below the cassette mounting member 17A of the other side.

The cassettes C are transferred up to a side of the loader chamber 12 by a cassette transfer mechanism, and are respectively mounted on the top surfaces of the cassette mounting unit 17A and 17B through sides thereof as shown with arrows "A" in FIG. 1. A turn table (not shown) is provided at each of the cassette mounting unit 17A and 17B to allow a semiconductor wafer loading/unloading port of each cassette C to face the wafer transfer mechanism 16. For the loader chamber 12, a loader chamber technique proposed in, for example, Japanese Patent Application No. 2006-132546 of the present assignee can be employed.

Figure 3:
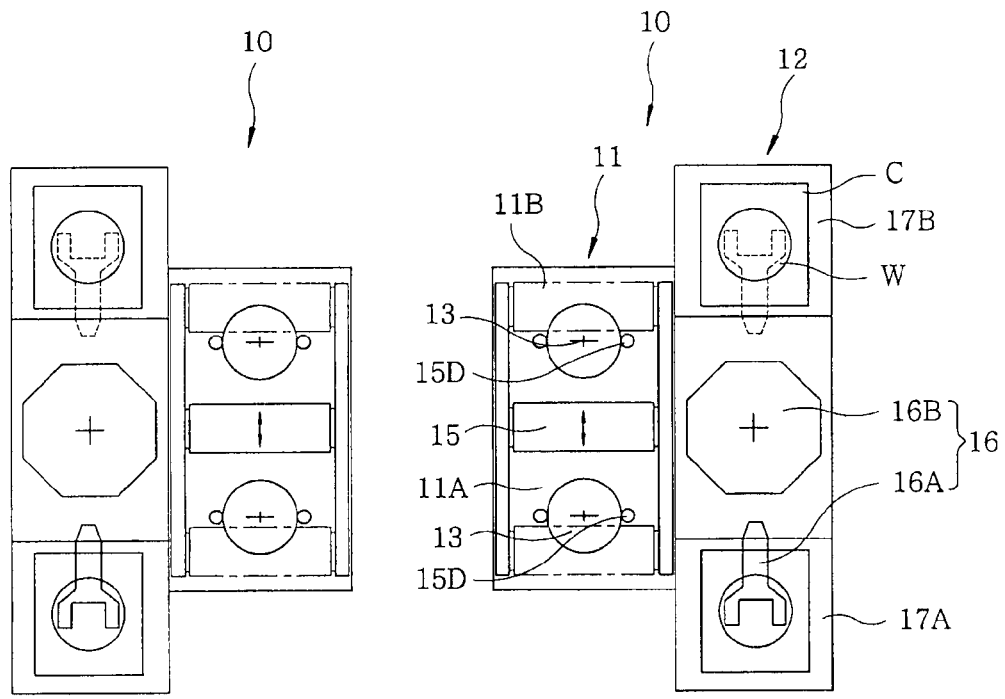
FIG. 3 illustrates an exemplary arrangement of the inspection apparatus of FIG. 1.
Figure 3:
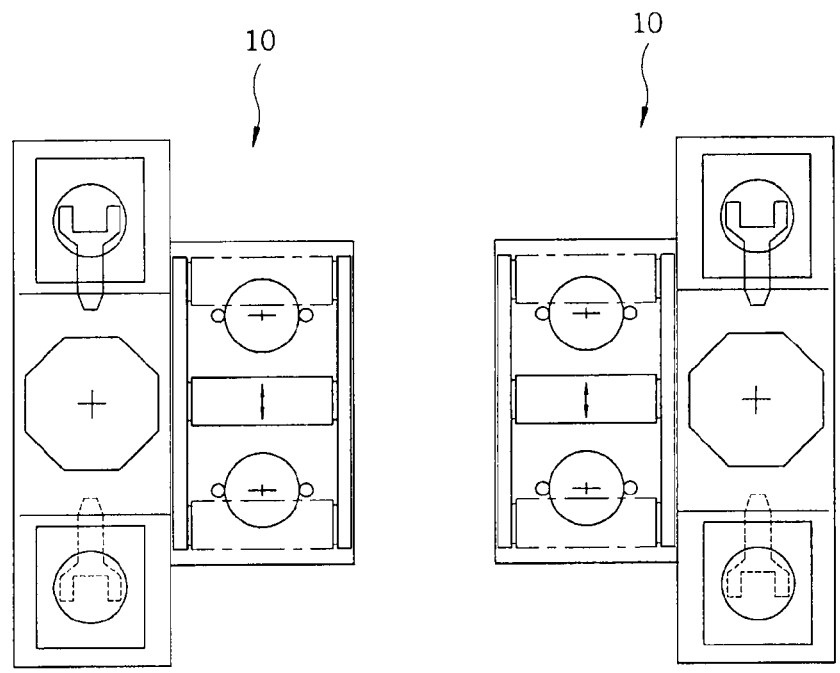

Each inspection apparatus 10 in accordance with the present embodiment is arranged in a clean room as partially illustrated in FIG. 3, for example. The cassettes C are loaded onto the cassette mounting unit 17A and 17B by an automatic guided vehicle (AGV) (not shown) which moves along transfer paths at left and right outer sides of, and the semiconductor wafers W inside the cassettes C are processed one by one by each inspection apparatus.

Figure 4A:
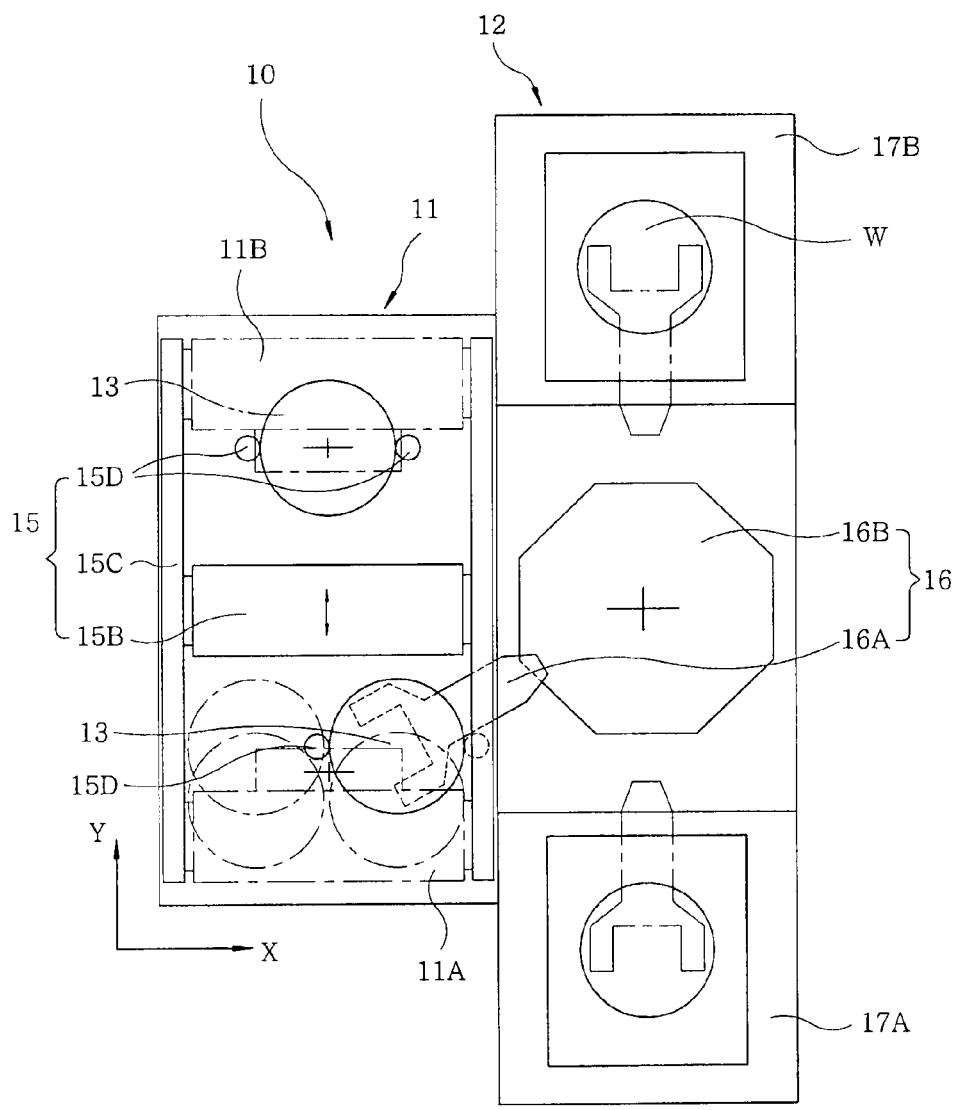
FIGS. 4A to 4C provide explanatory diagrams to describe an operation of the inspection apparatus of FIG. 1.

Next, an operation in accordance with the present embodiment will be explained with reference to FIG. 4. First, after the cassettes C are loaded on the cassette mounting unit 17A and 17B in the loader chamber 12 as shown in FIG. 4A, the arm 16A of the wafer transfer mechanism 16 is driven by the driving unit 16B. Then, the arm 16A unloads the semiconductor wafers W from the cassettes C one by one a pre-aligned semiconductor wafer W is transferred onto the wafer chuck 13 which waits in the first probe area 11A of the prober chamber 11.

Subsequently, to align the semiconductor wafer W with the probe card 14 in the first probe area 11A, the wafer chuck 13 is moved in the X and the Y direction as indicated by a solid line and dashed dotted lines in FIG. 4A, during which the second CCD cameras 15D in the two different positions capture images of the probes 14A of the probe card 14.

Figure 4B:
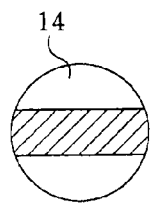

While the wafer chuck 13 is moved in the X and the Y direction, the two second CCD cameras 15D are moved in a rectangular image pickup area as indicated by a dashed dotted line in FIG. 4A, whereby images of probes 14A at plural locations, e.g., images of probes 14A for alignment at central and peripheral portions of the probe card 14, are captured within a rectangular hatched area shown in FIG. 4B. The controller 20 calculates the respective image pickup positions as XY coordinate values based on movement distances in the X and Y directions and stores them in a storage unit of the controller 20.

In the first embodiment, the left second CCD camera 15D takes images of the left half of the hatched area, while the right second CCD camera 15D takes images of the right half of the hatched area. In the prior art, the wafer chuck needs to be moved in the X direction by twice the distance to take images of the hatched area by one CCD camera, However, the wafer chuck 13 in the present embodiment needs to be moved in the X direction by only half the distance of the conventional chuck because the second CCD cameras 15D provided in the two different positions cover the respective half areas. This contributes the reduction of the footprint.

After the images of the probes 14A for alignment are captured by the second CCD cameras 15D, the alignment bridge 15B is moved up to a position of the first probe area 11A directly under the probe card 14 from the border between the first and the second probe area 11A and 11B and stopped thereat. At this time, the center of the probe card 14 lies on an extension line of an optical axis of the first CCD camera 15A.

Figure 4C:
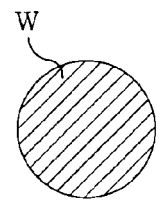

Subsequently, images of the inspection electrode pads are captured by the first CCD camera 15A provided at the alignment bridge 15B. Thus, as the wafer chuck 13 is moved in the X and the Y direction as shown in FIG. 4A, the entire region of the semiconductor wafer W is made to pass directly under the first CCD camera 15A, so that it becomes possible to take an image of the entire surface region of the semiconductor wafer W by the first CCD camera 15A, as shown in FIG. 4C. The first CCD camera 15A captures images of inspection electrode pads (not shown) corresponding to the probes 14A for alignment, that is, the inspection electrode pads located at a Y-directional center and the left and the right peripheral portion of the semiconductor wafer W, and the image pickup positions are registered in the storage unit of the controller 20 as XY coordinate values.

In the present embodiment, though the first CCD camera 15A is allowed to captures the images of the entire surface region of the semiconductor wafer W by moving the wafer chuck 13 in the X and the Y direction while the first CCD camera 15A is stopped directly under the center of the probe card 14, it is also possible to limit a Y-directional movement range of the wafer chuck 13 and capture the image of the entire surface of the semiconductor wafer W by the first CCD camera 15A by allowing the alignment bridge 15B to move in a movement range not covered by the limited movement range of the wafer chuck 13. With this arrangement, the footprint of the prober chamber 11 can be further reduced.

The wafer chuck 13 is moved in the X and the Y direction based on the image pickup data of the second CCD cameras 15D for the probes 14A and the image pickup data of the first CCD camera 15, whereby the alignment of the plural probes 14A with the plural inspection electrode pads corresponding thereto is carried out.

After the alignment, the wafer chuck 13 is moved to an initial inspection position, and, then, the wafer chuck 13 is elevated in the Z direction. As a result, the inspection electrode pads and the probes 14 corresponding thereto come into contact with each other, whereby all the probes 14A are made to contact their corresponding inspection electrode pads of the semiconductor wafer W. Further, when the wafer chuck 13 is overdriven, all the probes 14A corresponding to the inspection electrode pads of the semiconductor wafer W are brought into electrical contact therewith simultaneously. Next, by transmitting inspection signals from the tester to the probe card 14 sequentially, inspection of electrical characteristics can be carried out.

While the inspection of the semiconductor wafer W is being performed in the first probe area 11A, the wafer chuck 13 and the alignment mechanism 15 are operated in the second probe area 11B in the same way as in the first probe area 11A. Thus, since the inspection of another semiconductor wafer W can be performed in the second probe area 11B along with the inspection in the first probe area 11A, throughput can be enhanced.

After the inspections of the semiconductor wafers W are performed in parallel in the first and the second probe area 11A and 11B inside the prober chamber 11 individually, the inspected semiconductor wafers W are returned to the original positions inside the cassettes C from the first and the second probe area 11A and 11B by the wafer transfer mechanism 16 in an order by which the inspections are completed. Concurrently, a next semiconductor wafer W is transferred into corresponding one of the probe areas 11A and 11B of the prober chamber 11 from one of the cassettes C, and inspection of the semiconductor wafer W is successively conducted.

After inspections of all the semiconductor wafers W in the cassettes C are completed, these semiconductor wafers W are transferred by the AGV or the like while being accommodated in the cassettes to be subjected to a next process step.

In accordance with the first embodiment of the present invention described above, since the alignment bridge 15B of the alignment mechanism 15 is moved in the Y direction and is stopped according to the positions of the wafer chucks 13, the movement ranges of the wafer chucks 13 in the prober chamber 11 can be considerably reduced in comparison with the prior art when the alignment of the semiconductor wafers W and the probe cards 13 is conducted. As a result, a footprint in the clean room can be reduced. Further, since the single alignment mechanism 15 is shared by the wafer chucks 13 in the first and the second probe area 11A and 11B, costs for the apparatus can be reduced.

Moreover, in accordance with the first embodiment, since the two second CCD cameras 15D are provided at each wafer chuck 13, the movement range of the wafer chuck 13 can be further reduced, resulting in a reduction of footprint. Further, since the two second CCD cameras 15D are provided at locations distanced apart from each other by 180° with respect to the wafer chuck 13, and they are located on the X axis that passes through the center of the top surface of the wafer chuck 13, it is possible to capture images of the entire Y-directional center portion of the probe card 14, which enables an improvement of alignment accuracy.

(Second Embodiment)

Figure 5A:
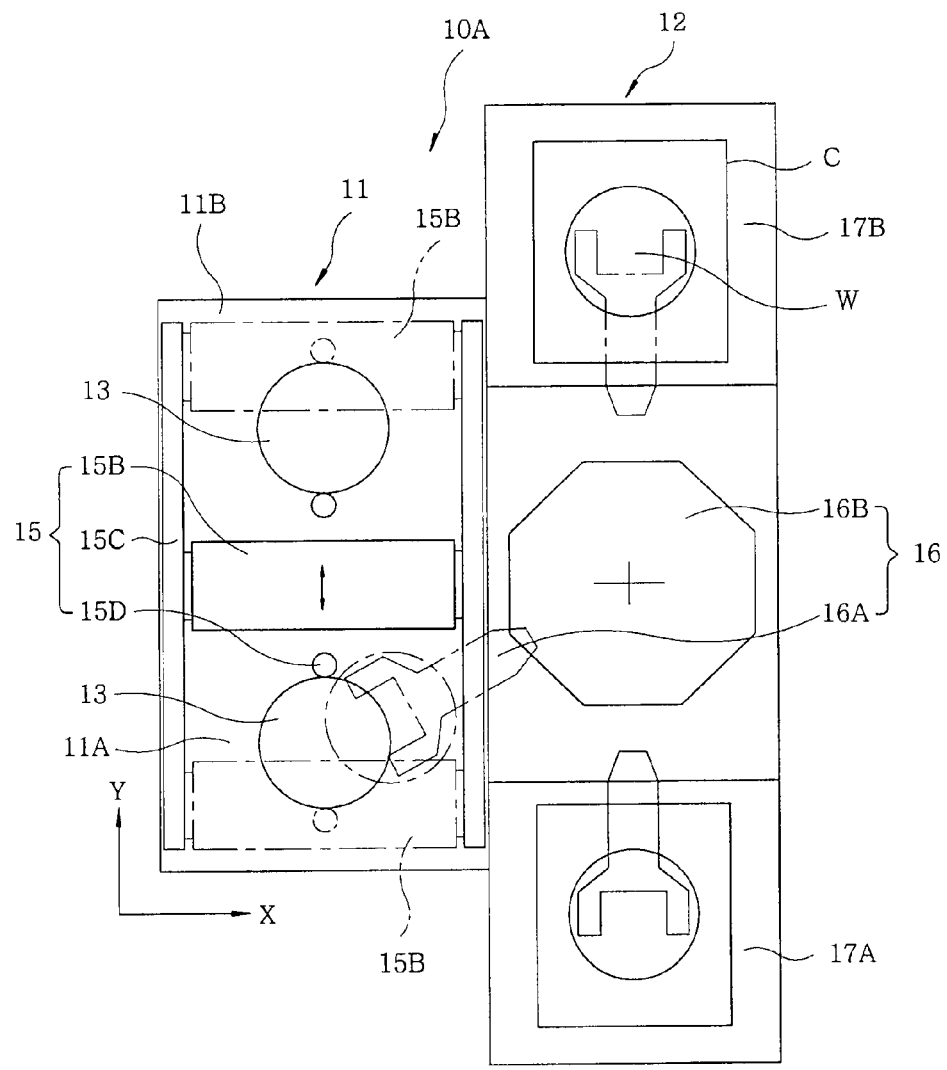
FIGS. 5A to 5C depict plan views to describe an inspection apparatus in accordance with a second embodiment of the present invention, wherein FIGS. 5A to 5C correspond to FIGS. 4A to 4C, respectively.

An inspection apparatus 10A in accordance with a second embodiment of the present invention has the same configuration as that of the first embodiment excepting that second CCD cameras 15D are provided on the Y axis which passes through a center of the top surface of each wafer chuck 13, as illustrated in FIG. 5A. Thus, parts identical or similar to those of the first embodiment will be assigned like reference numerals, and description of featuring parts of the present embodiment will be focused and elaborated.

In the second embodiment, the two second CCD cameras 15D are disposed along the Y axis while being distanced apart from each other by 180° along the circumferential direction of each wafer chuck 13, as shown in FIG. 5A. Accordingly, the two second CCD cameras 15D are protruded from the outer peripheral surface of the wafer chuck 13 in the Y direction, not in the X direction. Since the CCD cameras 15D do not protrude in the X direction, the X-directional width of the prober chamber 11 can be set to be smaller than that of the first embodiment, so that footprint can be further reduced as much as the reduced width of the prober chamber 11.

Figure 5B:
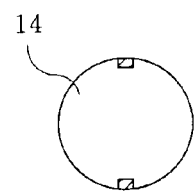
Figure 5C:
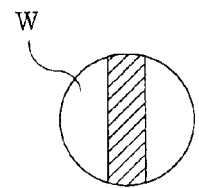

Since the two second CCD cameras 15D protrude from the outer peripheral surface of the wafer chuck 13 in the Y direction, an image pickup range of a probe card 14 is limited to both end portions of an X-directional center portion of the probe card 14 as illustrated in FIG. 5B. Furthermore, since the X-directional movement of the wafer chuck 13 is limited, an image pickup range by a first CCD camera 15A (see FIG. 2) provided at an alignment bridge 15B is also limited to a range which traverses an X-directional central portion of a semiconductor wafer W as shown in FIG. 5C.

In the second embodiment, though the image pickup ranges by the first and second CCD cameras 15D are limited in comparison with those of the first embodiment, it is possible to capture images of plural probes 14A (see FIG. 5B) arranged at a regular interval at both end portions of a X-directional center portion of the probe card 14 because probes 14A are formed on the entire surface of the probe card 14, and it is also possible to take images of inspection electrode pads of the semiconductor wafer W corresponding to the captured plural probes 14A, while achieving greater reduction of footprint. Therefore, there is no problem in conducting an alignment of the semiconductor wafer W and the probe card 14.

Accordingly, in accordance with the second embodiment, though the image pickup ranges of the semiconductor wafer W and the probe card 14 by the first and second CCD cameras 15A and 15D are limited in comparison with those of the first embodiment, the footprint of the prober chamber 11 can be reduced, thus greatly contributing to a reduction of costs.

Moreover, though not shown, it is also possible to provide two second CCD cameras at midway positions of those of the first and second embodiments, that is, at positions inclined by 45° from X and Y axes which pass through a center of the top surface of a wafer chuck. In such case, by setting an area of the prober chamber 11 to be substantially identical with that of the first embodiment, it is possible to take images of the entire surface of a semiconductor wafer by a first CCD camera and to take images of both end portions of a probe card inclined by 45° by the second CCD cameras.

(Third Embodiment)

Figure 6:
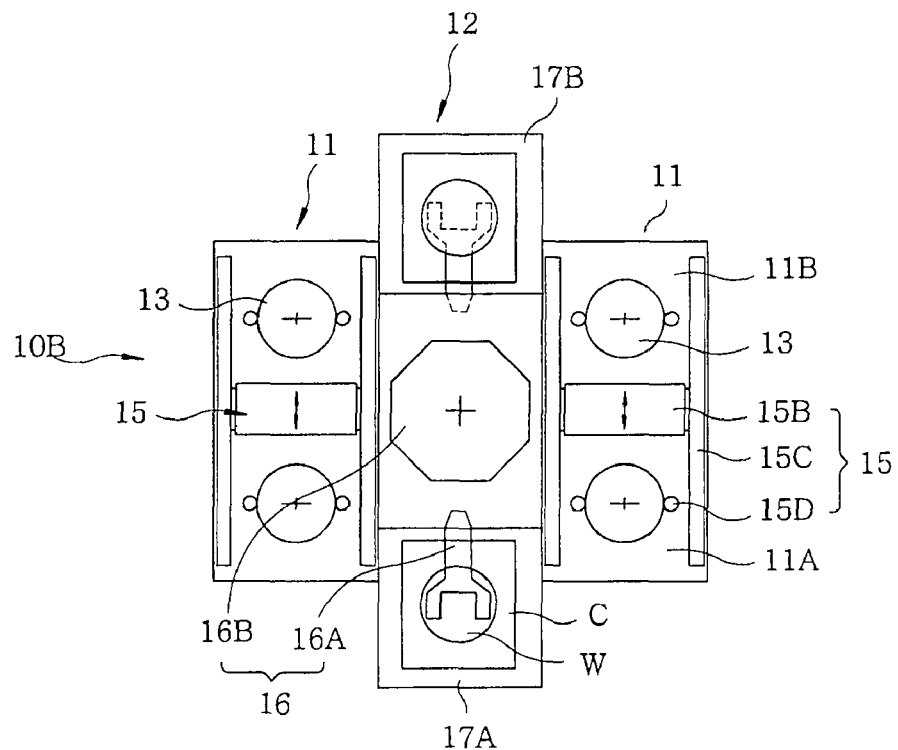
FIG. 6 presents a plan view showing an inspection apparatus in accordance with a third embodiment of the present invention, wherein FIG. 6 corresponds to FIG. 3.
Figure 6:
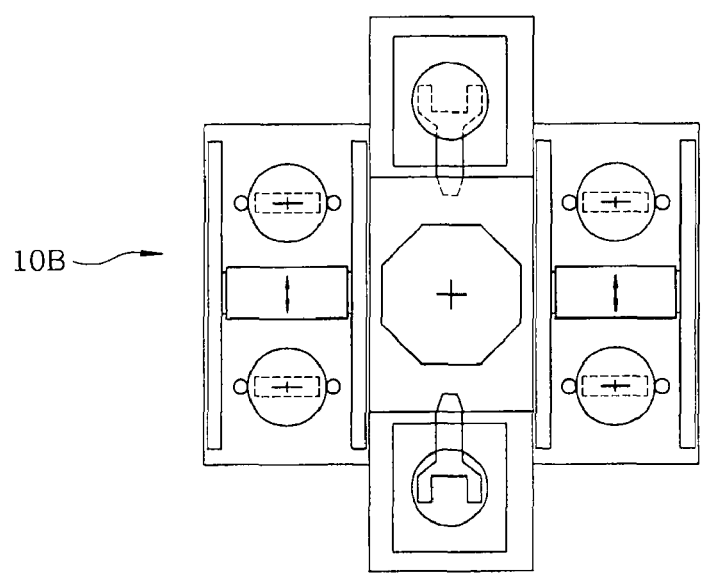

An inspection apparatus 10B in accordance with a third embodiment of the present invention has the same configuration as that of the first embodiment excepting that prober chambers 11 are disposed at left and right sides of a loader chamber 12 as illustrated in FIG. 6. Thus, parts identical or similar to those of the first embodiment will be assigned like reference numerals, and description of featuring parts of the present embodiment will be focused and elaborated.

In the third embodiment, since the left and right prober chambers share the single loader chamber 12, a footprint of the inspection apparatus 10B can be more considerably reduced in comparison with the first embodiment. Moreover, the same alignment process as in the first embodiment can be carried out in the prober chambers. Thus, since the two prober chambers 11 share the single loader chamber 12, the footprint can be greatly reduced, thus contributing to a reduction of costs greatly.

(Fourth Embodiment)

Figure 7A:
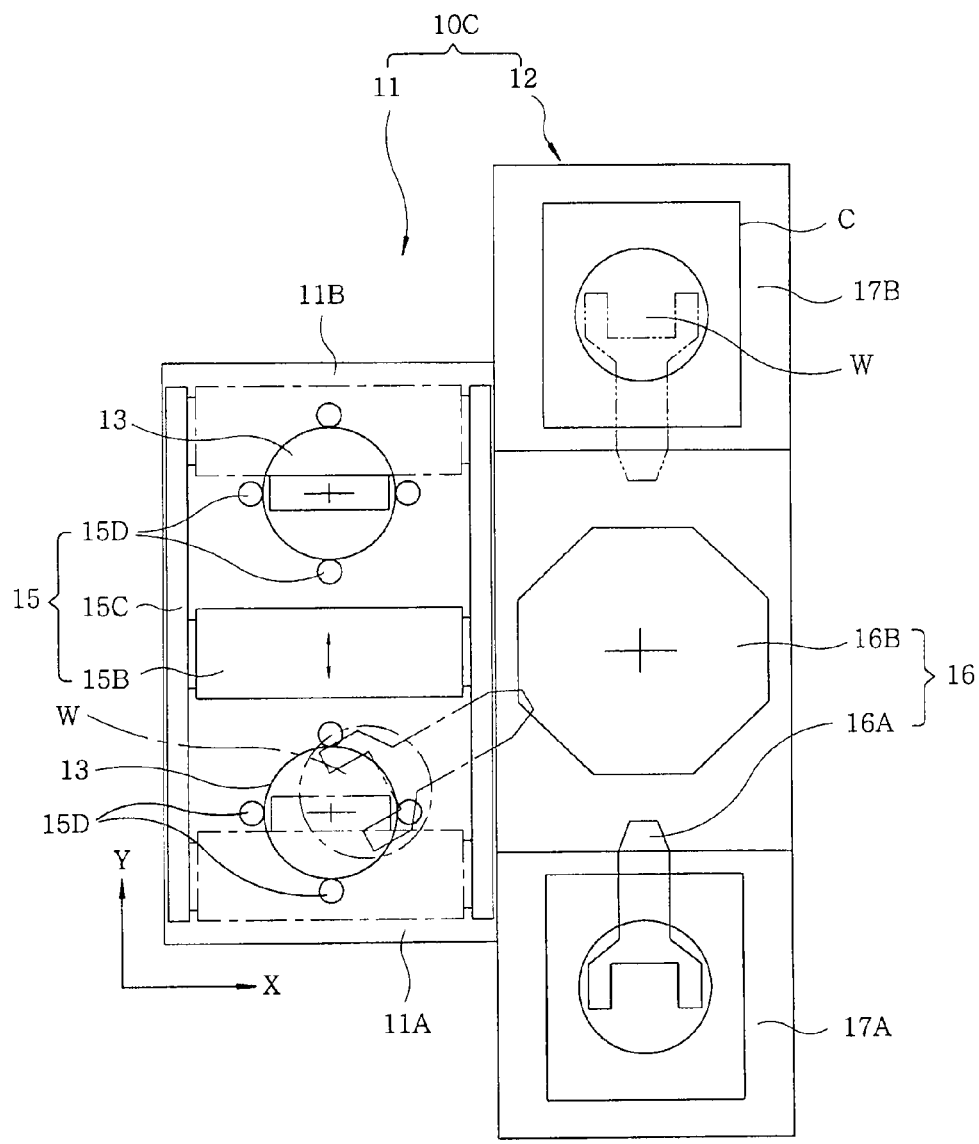
FIGS. 7A to 7C offer a plan view showing an inspection apparatus in accordance with a fourth embodiment of the present invention.

An inspection apparatus 10C in accordance with a fourth embodiment has the same configuration as that of the first embodiment excepting that four second CCD cameras are provided at positions on X and Y axes, which pass through a center of the top surface of each wafer chuck 13, while the wafer chuck 13 is interposed between the four second CCD cameras, as shown in FIGS. 7A. Thus, parts identical or corresponding to those of the first embodiment will be assigned like reference numerals, and description of featuring parts of the present embodiment will be focused and elaborated.

In the fourth embodiment, the four second CCD cameras 15D are provided while having the wafer chuck 13 interposed therebetween as illustrated in FIG. 7A. The four second CCD cameras 15D are in an arrangement which combines the two second CCD cameras 15D of the first embodiment and the two second CCD cameras 15D of the second embodiment. Further, a prober chamber 11 has the substantially same area as that of the first embodiment.

Figure 7B:
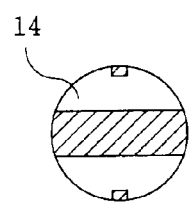
Figure 7C:
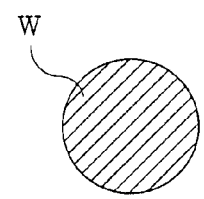

Accordingly, in accordance with the fourth embodiment, it is possible to capture images of the entire surface of a semiconductor wafer W by a first CCD camera 15A (see FIG. 2) of an alignment bridge 15B as shown in FIG. 7C and to capture images of a region that transverses a Y-directional center portion of a probe card 14 and both end portions of an X-directional center portion of the probe card 14 as shown in FIG. 7B. That is to say, since the four second CCD cameras 15D are capable of taking images of probes at a center portion of the probe card 14 and at four locations arranged at an interval of 90° along a circumferential direction of the outer periphery of the probe card 14, alignment accuracy can be further improved compared with those of the first to third embodiments.

In accordance with the fourth embodiment, it is possible to capture images of the entire surface of the semiconductor wafer W by means of the first CCD camera 15A and to capture images of the region that transverses a Y-directional center portion of a probe card 14 and both end portions of an X-directional center portion of the probe card 14. Therefore, alignment can be carried out at the center portion of the probe card 14 and at the four locations arranged at the interval of 90°; and thus the same effect as that of the first embodiment can be expected as well as the effect of achieving the higher alignment accuracy than those of the first to third embodiments.

Here, it is to be noted that the present invention is not limited to the embodiments described above. The individual constituent elements can be modified in various ways, if required.

The present invention has advantages when it is applied to an inspection apparatus for inspecting electrical characteristics of a target object such as a semiconductor wafer or the like.

While the invention has been shown and described with respect to the embodiments, it will be understood by those skilled in the art that various changes and modifications may be made without departing from the scope of the invention as defined in the following claims.

What is claimed is:

1. An inspection apparatus comprising:
   a plurality of mounting tables movable in X and Y directions and arranged along either one of the X and Y directions, the X and Y directions being straight, linear directions which are orthogonal to each other;
   an alignment mechanism which performs an alignment of target objects placed on the mounting tables, the alignment mechanism including an image pickup device which is movable only in an arrangement direction of the mounting tables to capture images of the respective target objects on the mounting tables and is allowed to be stopped at any position within a predetermined range in the arrangement direction for the mounting tables for which the image pickup device is movable; and
   a controller for performing the alignment of the target objects by moving the image pickup device and the mounting tables in their movable directions.

2. An inspection apparatus comprising:
   two mounting tables movable in X and Y directions and arranged along either one of the X and Y directions, the X and Y directions being straight, linear directions which are orthogonal to each other;
   an alignment mechanism which performs an alignment of target objects placed on the two mounting tables, the alignment mechanism including an image pickup device which is movable only in an arrangement direction of the two mounting tables to capture images of the respective target objects and is allowed to be stopped at any position within a predetermined range in the arrangement direction for the mounting tables for which the image pickup device is movable; and
   a controller for performing the alignment of one of the target objects by moving the image pickup device and the mounting tables in their movable directions.

3. The inspection apparatus of claim 1 or 2, further comprising a probe card disposed above each mounting table, wherein additional image pickup devices for capturing an image of the probe card are provided at plural locations of each mounting table which are distanced away from each other at a specific interval.

4. The inspection apparatus of claim 1 or 2, further comprising a probe card disposed above each mounting table, wherein two additional image pickup devices are provided at two locations of each mounting table which are distanced away from each other at an interval of 180° in a circumferential direction of each mounting table.

5. The inspection apparatus of claim 4, wherein the two additional image pickup devices are opposedly disposed along the arrangement direction of the mounting tables.

6. The inspection apparatus of claim 4, wherein the two additional image pickup devices opposedly are disposed along a direction perpendicular to the arrangement direction of the mounting tables.

7. The inspection apparatus of claim 4, wherein the two additional image pickup devices opposedly are disposed at locations inclined from the X and Y directions by 45°.

8. The inspection apparatus of claim 3, wherein the additional image pickup devices are disposed at four locations distanced away from each other at an interval of 90° along a circumferential direction of each mounting table, and two pairs of the additional image pickup devices located at an interval of 180° are arranged along the X direction and the Y directions, respectively.

9. The inspection apparatus of claim 3, wherein the probe card is brought into electrical contact with the entire surface of a corresponding target object.

10. The inspection apparatus of claim 1 or 2, wherein the image pickup device is provided at an alignment bridge.

11. The inspection apparatus of claim 1 or 2, wherein the controller performs the alignment by controlling each mounting table to be moved only in a direction perpendicular to a direction in which the image pickup device is movable.

12. The inspection apparatus of claim 1 or 2, further comprising a wafer transfer mechanism between the mounting tables for delivering the target objects.

\* \* \* \* \*